United States Patent

Sato (10) Patent No.: US 8,936,707 B2
(45) Date of Patent: *Jan. 20, 2015

(54) SPUTTERING TARGET OF NONMAGNETIC-PARTICLE-DISPERSED FERROMAGNETIC MATERIAL

(75) Inventor: Atsushi Sato, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 359 days.

This patent is subject to a terminal disclaimer.

(21) Appl. No.: 13/613,406

(22) Filed: Sep. 13, 2012

(65) Prior Publication Data

US 2013/0001079 A1    Jan. 3, 2013

Related U.S. Application Data

(62) Division of application No. 12/745,278, filed as application No. PCT/JP2009/056298 on Mar. 27, 2009, now Pat. No. 8,568,576.

(30) Foreign Application Priority Data

Mar. 28, 2008   (JP) .................................. 2008-087395

(51) Int. Cl.
*C25B 9/00* (2006.01)
*C25B 11/00* (2006.01)
*C25B 13/00* (2006.01)
(Continued)

(52) U.S. Cl.
CPC ................. *G11B 5/851* (2013.01); *C22C 19/07* (2013.01); *C22C 49/08* (2013.01); *C22C 49/14* (2013.01); *C23C 14/3414* (2013.01); *H01F 41/183* (2013.01); *C22C 2202/02* (2013.01)

USPC .......... 204/298.13; 204/298.12; 252/62.51 C; 252/520.3; 252/521.2

(58) Field of Classification Search
CPC .... C23C 14/3414; C22C 19/07; C22C 49/08; C22C 49/14; C22C 2202/02; G11B 5/851; H01F 41/183
USPC ................. 204/298.12, 298.13; 252/62.51 C, 252/520.3, 521.2
See application file for complete search history.

(56) References Cited

U.S. PATENT DOCUMENTS 6,406,600 B1   6/2002   Takashima
6,716,542 B2   4/2004   Uwazumi et al.
(Continued)

FOREIGN PATENT DOCUMENTS

JP   10-088333 A      4/1998
JP   2004-339586 A   12/2004
(Continued)

*Primary Examiner* — Michael Band
(74) *Attorney, Agent, or Firm* — Howson & Howson LLP (57) ABSTRACT

A sputtering target of nonmagnetic-particle-dispersed ferromagnetic material is provided having a phase (A) such that nonmagnetic particles are dispersed in a ferromagnetic material formed from a Co—Cr alloy containing 5 at % or more and 20 at % or less of Cr and Co as the remainder thereof, and schistose textures (B) with a short side of 30 to 100 μm and a long side of 50 to 300 μm formed from a Co—Cr alloy phase in the phase (A); wherein each of the foregoing nonmagnetic particles has such a shape and size that the particle is smaller than all hypothetical circles with a radius of 1 μm around an arbitrary point within the nonmagnetic particle, or a shape and size with at least two contact points or intersection points between the respective hypothetical circles and the interface of the ferromagnetic material and the nonmagnetic material.

5 Claims, 9 Drawing Sheets (51) Int. Cl.

| | |
|---|---|
| *C23C 14/00* | (2006.01) |
| *C04B 35/00* | (2006.01) |
| *C09D 5/23* | (2006.01) |
| *H01L 29/12* | (2006.01) |
| *H01B 1/02* | (2006.01) |
| *G11B 5/851* | (2006.01) |
| *C22C 19/07* | (2006.01) |
| *C22C 49/08* | (2006.01) |
| *C22C 49/14* | (2006.01) |
| *C23C 14/34* | (2006.01) |
| *H01F 41/18* | (2006.01) |

(56) References Cited

U.S. PATENT DOCUMENTS

| | | | |
|---|---|---|---|
| 7,909,949 | B2 | 3/2011 | Nakamura et al. |
| 7,927,434 | B2 | 4/2011 | Nakamura et al. |
| 2002/0106297 | A1 | 8/2002 | Ueno et al. |
| 2003/0228238 | A1 | 12/2003 | Zhang et al. |
| 2005/0223848 | A1 | 10/2005 | Ueno et al. |
| 2006/0185771 | A1 | 8/2006 | Inoue et al. |
| 2006/0234091 | A1 | 10/2006 | Racine et al. |
| 2007/0187236 | A1 | 8/2007 | Nakamura et al. |
| 2007/0189916 | A1 | 8/2007 | Zhang |
| 2007/0209547 | A1 | 9/2007 | Irumata et al. |
| 2008/0062575 | A1 | 3/2008 | Shimizu |
| 2009/0242393 | A1 | 10/2009 | Satoh |
| 2009/0308740 | A1 | 12/2009 | Kato et al. |
| 2010/0089622 | A1 | 4/2010 | Irumata et al. |
| 2010/0270146 | A1 | 10/2010 | Nonaka et al. |
| 2011/0247930 | A1 | 10/2011 | Sato |
| 2011/0284373 | A1 | 11/2011 | Sato et al. |
| 2012/0097535 | A1 | 4/2012 | Ogino et al. |
| 2012/0118734 | A1 | 5/2012 | Sato et al. |

FOREIGN PATENT DOCUMENTS

| | | |
|---|---|---|
| JP | 2006-176808 A | 7/2006 |
| JP | 2008-163438 A | 7/2008 |
| JP | 2009-001860 A | 1/2009 |
| JP | 2009-001861 A | 1/2009 |
| JP | 2009-001862 A | 1/2009 |
| WO | 2007/080781 A1 | 7/2007 |
| WO | 2007/116834 A1 | 10/2007 |

SPUTTERING TARGET OF NONMAGNETIC-PARTICLE-DISPERSED FERROMAGNETIC MATERIAL

CROSS REFERENCE TO RELATED APPLICATIONS

This application is a divisional of co-pending U.S. application Ser. No. 12/745,278 which is the National Stage of International Application No. PCT/JP2009/056298, filed Mar. 27, 2009, which claims the benefit under 35 USC 119 of Japanese Application No. 2008-087395, filed Mar. 28, 2008.

BACKGROUND

The present invention relates to a sputtering target of nonmagnetic-particle-dispersed ferromagnetic material, and in particular relates to a target that can be efficiently subjected to sputtering with a DC (direct current) magnetron sputtering system by improving the PTF (pass through flux). The present invention further relates to a sputtering target of nonmagnetic-particle-dispersed ferromagnetic material which realizes stable sputtering and optimal deposition speed when forming a film by sputtering, minimal arcing during the sputtering, reduction in the particles (dust) and nodules caused by such arcing, high density, minimal variation in quality, and improvement of mass productivity.

In the field of magnetic recording, technology has been developed for improving the magnetic property by causing a nonmagnetic material to coexist in a magnetic thin film. As examples, there are technology for improving the soft magnetic property such as magnetic permeability by having fine particles of nonmagnetic material in the magnetic thin film, and technology for improving various properties of a magnetic recording medium such as coercivity by using the nonmagnetic material to block or weaken the magnetic interaction between the fine metallic particles in the magnetic thin film material. Although this kind of thin film material is prepared based on normal sputtering, it is necessary to simultaneously sputter nonmagnetic materials with insulation property or high resistance and ferromagnetic materials composed from metals of low resistance. This sputtering method is to make a positive electrode substrate and a negative electrode target face each other, and generate an electric field by applying high voltage or radio frequency between the substrate and the target under an inert gas atmosphere. Here, the sputtering method employs a principle where inert gas is ionized, plasma formed from electrons and positive ions is formed, the positive ions in this plasma collide with the target (negative electrode) surface to knock out the constituent atoms of the target, and the extruded atoms adhere to the opposing substrate surface to form a film.

Generally speaking, as the sputtering method, the RF (radio frequency) sputtering method or the DC (direct current) sputtering method may be used. However, in order to simultaneously sputter materials with significantly different resistance, the RF sputtering method capable of sputtering an insulator is often used. Nevertheless, not only is the RF (radio frequency) sputtering device expensive, it possesses numerous drawbacks such as inferior sputtering efficiency, large power consumption, complex control and slow deposition speed. If high power is applied to increase the deposition speed, the substrate temperature will rise, and there is a problem in that this will cause deterioration in the substrate and deposition material. Meanwhile, if the DC magnetron sputtering system which is capable of sealing the plasma in the vicinity of the target by disposing a magnet on the back side of the target and leaking magnetic flux from the target surface is used, the DC sputtering method will be able to achieve low power consumption, high speed deposition, and superior mass productivity in comparison to the RF sputtering method. In addition, it is generally said that the DC sputtering method is able to produce high-quality films since the influence of the plasma on the substrate is small.

Accordingly, a sputtering target for simultaneously sputtering a nonmagnetic material and a ferromagnetic material is also devised so that deposition can be performed with the DC magnetron sputtering system as much as possible. However, when adopting the DC sputtering method, the target itself needs to possess conductive property. Even if the target possesses conductive property, such target that contains large amounts of nonconductive materials such as oxide and silicide makes deposition based on the DC sputtering method difficult since the bulk resistance of the target will increase. Thus, a sputtering target has been devised to have a structure in which nonmagnetic materials such as oxide are finely and spherically dispersed. Nevertheless, even with this kind of devisal, there is a problem in that large amounts of particles are generated, and a problem in that the PTF (pass through flux) is low and the deposition speed is slow.

Some conventional technologies are introduced below. As one example, proposed is a method of performing mechanical ironing to alloy powder having an alloy phase prepared with the rapid solidification method, and ceramic-phase powder (refer to Japanese Patent Laid-Open Publication No. H10-88333). According to this method, it is possible to obtain a sputtering target for use in a magnetic recording medium by preparing alloy powder in which ceramic-phase powder is evenly dispersed in the alloy powder, and thereafter molding this by way of hot pressing.

As another example, proposed is Co-base alloy containing a silica phase in which the average width sought with the line segment method is in the range of 0.5 to 5 μm, as well as Cr and Pt phases (refer to Japanese Patent Laid-Open Publication No. 2004-339586). The silica powder in this case is obtained with a special method of high-temperature flame hydrolysis. Nevertheless, with respect to the materials obtained with the foregoing methods, in the former case (first example), the object is simply forming the particles homogeneously as much as possible, and in the latter case (second example), although a target texture distributed in a web shape is obtained, the existence of coarse grains can be observed in certain places. Based on these types of methods, it is assumed that particles will increase enormously upon forming a film based on sputtering as described later, which will be unfit as a target material.

Moreover, as an example of a magnetic target, disclosed are a CoPt-base sputtering target (refer to Japanese Patent Laid-Open Publication No. 2000-282229), and a sputtering target with improved PTF (refer to Japanese Patent Laid-Open Publication No. 2005-530925). Nevertheless, these documents relate to a metal (alloy) target, and do not face the problems encountered with a target in which nonmagnetic particles are dispersed.

Japanese Patent Laid-Open Publication Nos. 2009-001860, 2009-001861 and 2009-001862 disclose technology of improving the PTF (pass through flux) by using Co—Cr alloy powder, Co—Cr—B alloy powder or Co—Cr—Pt alloy powder having an average grain size of 20 μm as the raw powder, and causing the target texture to become a diplophase structure by suppressing the diffusion during the sintering process as much as possible. In the foregoing case, however, it is necessary to set the sintering temperature to be low and, consequently, such different problems as the density being low and particles being generated will arise. Therefore, there is a problem with those inventions that no improvement in target characteristics can be expected.

In light of the above, the present Applicant developed a high-density sputtering target of nonmagnetic-particle-dispersed ferromagnetic material, which is capable of reducing the generation of particles (dust) and nodules generated during the sputtering process and improving the mass productivity with minimal variation in quality, by improving such a phase that particles of nonmagnetic material are dispersed in a ferromagnetic material (refer to Japanese Patent Application No. 2006-006575). The present invention is a further improvement of the foregoing invention.

SUMMARY

In light of the above, an object of the present invention is to provide a high-density sputtering target of nonmagnetic-particle-dispersed ferromagnetic material whose crystal grains are fine, in particular a suitable sputtering target for a magnetic recording layer, which realizes improvement of PTF (pass through flux) and highly efficient deposition with the DC magnetron sputtering system when forming a film by sputtering, reduction in the particles (dust) and nodules generated during the sputtering, minimal variation in quality, and improvement of mass productivity. In order to achieve the foregoing object, the present inventors discovered, as a result of intense study, that the particles and nodules generated during the sputtering can be considerably reduced by: adjusting the texture and structure of the metal (alloy) as the magnetic material and the dispersion morphology of nonmagnetic particles and providing conductive property to enable the DC sputtering; further improving the PTF (pass through flux) to realize a highly efficient deposition with the DC magnetron sputtering system; and improving the density.

Based on the foregoing discovery, the present invention provides a sputtering target of nonmagnetic-particle-dispersed ferromagnetic material in which nonmagnetic particles formed of oxides are dispersed in a ferromagnetic material formed from a Co—Cr alloy containing 5 at % or more and 20 at % or less of Cr and Co as the remainder thereof, the sputtering target of nonmagnetic-particle-dispersed ferromagnetic material characterized in that: the sputtering target contains a phase (A) such that the nonmagnetic particles are dispersed in the ferromagnetic material, and schistose textures (B) with a short side of 30 to 100 μm and a long side of 50 to 300 μM formed from a Co—Cr alloy phase in the phase (A); and each of the nonmagnetic particles has such a shape and size that the particle is smaller than all hypothetical circles with a radius of 1 μm around an arbitrary point within the nonmagnetic particle, or a shape and size with at least two contact points or intersection points between the respective hypothetical circles and the interface of the ferromagnetic material and the nonmagnetic material.

Specifically, the present invention does not cover a particle that is larger than a hypothetical circle with a radius of 1 μm around an arbitrary point in the nonmagnetic particle, or such a coarse particle that does not have any contact point or intersection point with the interface and that a hypothetical circle is contained in a nonmagnetic particle.

So as long as the foregoing conditions are satisfied, there is no particular limitation on the shape and size of the nonmagnetic particles. For example, even if it has a thread-like shape having a length of 2 μm or longer or a dendritic shape finely branched, the object of the present invention can be achieved so as long as the foregoing conditions are satisfied. These kinds of particle shapes or fine particles will hardly influence the generation of particles. The particles of nonmagnetic material dispersed in the ferromagnetic material do not necessarily have to be spherical. Rather, it could be said that thread-shaped, star-shaped or web-shaped particles are more preferable than spherical particles. The large spherical grains observed in the polished face easily cause shedding, and the generation of particles is strongly affected by the occurrence of shedding.

The thread-shaped or star-shaped or web-shaped texture observed in the polishing of the surface also exists in the thickness direction of the target as a matter of course. Like this, the thread-shaped or star-shaped or web-shaped texture bonded in the thickness direction of the target will hardly cause shedding. Increase in the area of contact between the ferromagnetic material and the nonmagnetic material such as oxides is effective in preventing shedding. Thus, it could be said that it is desirable for the width of the thread-like shape or web shape to be small and the nonmagnetic particles of such shapes to be dispersed.

The condition of the present invention, in which the nonmagnetic particle is smaller than all hypothetical circles with a radius of 1 μm around an arbitrary point within the nonmagnetic particle, or the nonmagnetic particle has at least two contact points or intersection points between the respective hypothetical circles and the interface of the ferromagnetic material and the nonmagnetic material, covers the foregoing thread-shaped or star-shaped or web-shaped texture.

In the foregoing sputtering target of nonmagnetic-particle-dispersed ferromagnetic material, the existence of the schistose texture (B) formed from a Co—Cr alloy phase is a significant factor in improving the PTF (pass through flux). This schistose texture (B) can be clearly observed with an SEM. The schistose texture (B) is mostly schistose, and forms an alloy phase where Cr is concentrated at 25 at % or more near the center and the Cr content becomes lower toward the periphery than the central part. In other words, the schistose texture (B) is non-uniform in composition when comparing the central part and the periphery.

Since the distribution status of the Cr concentration in the schistose texture (B) formed from a Co—Cr alloy phase changes pursuant to the sintering temperature or the properties of the raw powder, it is not possible to clearly define. But in many cases, the formation of such Co—Cr alloy phase can be confirmed. There is considerable variation in the size of schistose particles, but in many cases, the short side of a schistose particle is within the range of 30 to 100 μm and the long side of a schistose particle is within the range of 50 to 300 μm. Here, the short side of a schistose particle shall be defined as a diameter of the maximum inscribed circle among any circles inscribed in the schistose texture (B), and the long side of a schistose particle shall be defined as the length of the longest line segment with no intersection with the contour (periphery) of the schistose texture (B) among the line segments connecting two arbitrary points on the contour.

The present invention additionally provides a sputtering target of nonmagnetic-particle-dispersed ferromagnetic material in which nonmagnetic particles formed of oxides are dispersed in a ferromagnetic material formed from a Co—Cr—Pt alloy containing 5 at % or more and 20 at % or less of Cr, 5 at % or more and 30 at % or less of Pt, and Co as the remainder thereof, the sputtering target of nonmagnetic-particle-dispersed ferromagnetic material characterized in that: the sputtering target contains a phase (A) such that the nonmagnetic particles are dispersed in the ferromagnetic material, and schistose textures (B) with a short side of 30 to 100 μm and a long side of 50 to 300 μm formed from a Co—Cr—Pt alloy phase in the phase (A); and each of the nonmagnetic particles has such a shape and size that the particle is smaller than all hypothetical circles with a radius of 1 μm around an arbitrary point within the nonmagnetic particle, or a shape and size with at least two contact points or intersection points between the respective hypothetical circles and the interface of the ferromagnetic material and the nonmagnetic material.

Also in the foregoing case, the schistose texture (B) forms an alloy phase where Cr is concentrated at 25 at % or more near the center and the Cr content becomes lower toward the periphery than the central part. In other words, the schistose texture (B) is non-uniform in composition when comparing the central part and the periphery.

The present invention further provides a sputtering target of nonmagnetic-particle-dispersed ferromagnetic material in which nonmagnetic particles formed of oxides are dispersed in a ferromagnetic material formed from a Co—Cr—Pt—B alloy containing 5 at % or more and 20 at % or less of Cr, 5 at % or more and 30 at % or less of Pt, 0.5 at % or more and 8 at % or less of B, and Co as the remainder thereof, the sputtering target of nonmagnetic-particle-dispersed ferromagnetic material characterized in that: the sputtering target contains a phase (A) such that the nonmagnetic particles are dispersed in the ferromagnetic material, and schistose textures (B) with a short side of 30 to 100 μm and a long side of 50 to 300 μm formed from a Co—Cr—Pt—B alloy phase in the phase (A); and each of the nonmagnetic particles has such a shape and size that the particle is smaller than all hypothetical circles with a radius of 1 μm around an arbitrary point within the nonmagnetic particle, or a shape and size with at least two contact points or intersection points between the respective hypothetical circles and the interface of the ferromagnetic material and the nonmagnetic material.

Also in the foregoing case, the schistose texture (B) forms an alloy phase where Cr is concentrated at 25 at % or more near the center and the Cr content becomes lower toward the periphery than the central part. In other words, the schistose texture (B) is non-uniform in composition when comparing the central part and the periphery.

The sputtering target of nonmagnetic-particle-dispersed ferromagnetic material according to the present invention is similarly effective as a high PTF (pass through flux) target if, in any cutting plane of the target, the area ratio occupied by the textures (B) is 4% or more and 30% or less relative to the area of the overall cutting plane including the matrix phase (A) in which the nonmagnetic particles are dispersed. Oxides are used as the nonmagnetic material to be dispersed, and particularly it is effective to select one or more types of oxides from Cr, Ta, Si, Ti, Zr, Al, Nb and B. The sputtering target of nonmagnetic-particle-dispersed ferromagnetic material according to the present invention covers all of the foregoing aspects.

Desirably, the volume ratio of the nonmagnetic material formed from oxides is 10% or more and 30% or less in the target. Consequently, the present invention will effectively function as a high PTF (pass through flux) sputtering target of nonmagnetic-particle-dispersed ferromagnetic material.

With the sputtering target of nonmagnetic-particle-dispersed ferromagnetic material according to the present invention, the nonmagnetic material is preferably an oxide that will not be reduced or decomposed even when it is ignited at 800 to 1200° C. together with ferromagnetic metal materials in a vacuum or an inert atmosphere. However, a compatible material may be arbitrarily selected among the foregoing oxides. This is in order to avoid such unexpected effect that the composition varies due to the reduction or decomposition during the production of the target.

The density of the sputtering target of nonmagnetic-particle-dispersed ferromagnetic material according to the present invention is desirably 97% or higher in relation to the density calculated based on the following formula.

Formula: Calculated density=Σ(molecular weight× molar ratio)/Σ(molecular weight×molar ratio/ density)

As described above, the adjusted target becomes a high PTF (pass through flux) target and, when using it with the DC magnetron sputtering system, this target exhibits superior effects that ionization of inert gas resulted from the cycloidal motion of the charged particles efficiently progresses and the deposition speed can be increased thereby. Thus, high-speed deposition based on DC sputtering is enabled without increasing the pressure of the sputtering gas or the applied voltage. Moreover, in comparison to an RF sputtering system, the DC sputtering system is advantageous in that it is inexpensive and easy to control, and has low power consumption. Therefore, by using the sputtering target of the present invention, it is possible to obtain a high-quality material, and in particular a superior effect is yielded in that a magnetic material can be manufactured stably and at low cost. Moreover, densification of the sputtering target of the present invention enables inhibition of the shedding of the nonmagnetic material, reduction of pores and refinement of the crystal grains by increasing adhesion of the nonmagnetic material and the ferromagnetic material, and achieves a smooth sputtered target face. Thus, the present invention yields a superior effect of being able to reduce the particles and nodules during sputtering and prolong the target life.

DETAILED DESCRIPTION

Upon producing the sputtering target of nonmagnetic-particle-dispersed ferromagnetic material according to the present invention, two or more types of metallic powder selected from Co, Cr and Pt are used, or the alloy powder of such metals is used. The foregoing powders and one or more types of oxide powder with an average grain size of roughly 1 µm selected from Cr, Ta, Si, Ti, Zr, Al, Nb and B as the nonmagnetic material are mixed with a ball mill or the like for approximately 20 to 100 hours, and thereafter the mixed powder is sintered with the HP (hot press) method at a temperature of 1000 to 1250° C. It is thereby possible to achieve a relative density of 97% or higher. Atomized powder may also be used as the metal material. Pulverization and mixing may also be performed using mechanical ironing in addition to employing a ball mill.

Moreover, sintering is not limited to the hot press method, and the plasma discharge sintering method or hot isostatic sintering method may also be used. The target of the present invention that was produced as described above is characterized in that, in the phase (A), all particles of the nonmagnetic material with a texture observed on the polished face of the material have such a shape and size that each particle is smaller than all hypothetical circles with a radius of 1 µm around an arbitrary point within the nonmagnetic particle, or a shape and size with at least two contact points or intersection points between the respective hypothetical circles and the interface of the ferromagnetic material and the nonmagnetic material. It could be said that the nonmagnetic particles are often fine spherical particles, or fine thread-shaped or star-shaped or web-shaped particles.

Moreover, the sputtering target of nonmagnetic-particle-dispersed ferromagnetic material according to the present invention contains schistose textures (B) with a short side of 30 to 100 µm and a long side of 50 to 300 µm formed from a Co—Cr alloy phase, a Co—Cr—Pt alloy phase or a Co—Cr—Pt—B alloy phase in the phase (A) such that nonmagnetic particles formed of the oxides are dispersed in a ferromagnetic material of the Co—Cr alloy, the Co—Cr—Pt alloy or the Co—Cr—Pt—B alloy. That is, the schistose texture (B) has a texture that is encompassed with the phase (A) in which the nonmagnetic particles are dispersed. This is a significant feature of the present invention.

The foregoing schistose texture (B) does not necessarily have a uniform composition. Specifically, the schistose texture (B) forms an alloy phase having a composition where Cr is concentrated at 25 at % or more near the center and the Cr content becomes gradually lower toward the periphery than the central part. Since the concentration gradient thereof will vary depending on each schistose texture (B), this cannot be categorically identified. However, the Cr concentration near the center of the schistose texture (B) was higher than the periphery of the schistose texture (B).

Nevertheless, the schistose textures (B) do not exist considerably in the target structure of nonmagnetic-particle-dispersed ferromagnetic material, and the phase (A) in which the nonmagnetic particles are dispersed is the main component. Preferably, as the amount of the phase (A), in any cutting plane of the target, the area ratio occupied by the textures (B) is 4% or more and 30% or less relative to the area of the overall cutting plane including the phase (A) in which the nonmagnetic particles are dispersed. The remaining composition is configured from the nonmagnetic-particle-dispersed ferromagnetic material. Moreover, it is preferable that the volume ratio of the nonmagnetic material in the phase (A) in which the nonmagnetic particles are dispersed is 10% or more and 30% or less in the target.

As described above, the adjusted target of nonmagnetic-particle-dispersed ferromagnetic material according to the present invention becomes a high PTF (pass through flux) target and, when using it with the DC magnetron sputtering system, this target exhibits superior effects that ionization of inert gas resulted from the cycloidal motion of the charged particles efficiently progresses and the deposition speed can be increased thereby. The PTF (pass through flux) is now explained. The reason why the leak field is reduced in the ferromagnetic target is because the energy of the system is reduced and the magnetization within the target is thereby aligned in the direction (N pole→S pole) of the magnetic field. If the target is a nonmagnetic substance with no magnetization reaction, the lines of magnetic force will travel along the same orbit with or without a target.

As a parameter showing the magnetizability in relation to the magnetic field, there is magnetic permeability. If the magnetic permeability of the target is low, it is assumed that the leaked magnetic field will increase. In fact, as a result of measuring a B-H loop on a small coupon that was taken from a high PTF target, the magnetic permeability tended to be low in comparison to those produced based on a standard production method. As one reason the magnetic permeability decreases (=magnetization is difficult to be aligned in the direction of the magnetic field), the ferromagnetic phase is divided due to the presence of a Cr-rich nonmagnetic phase in the schistose texture (B) and the exchange interaction between the ferromagnetic phases becomes weak.

The variation in composition of the schistose texture (B) causes local distortion in the crystal lattice. The electrons contributing to the magnetization are closely related to the crystal structure, and the magnetic moments are also mutually nonparallel in the areas subject to lattice distortion. Accordingly, in order to align the magnetic moments of these electrons, an even stronger magnetic field is required. Although there are attempts to improve the PTF by applying strain to the target through cold rolling, it is considered that similar effects are yielded. Lowering the density or increasing the dispersed nonmagnetic material will also increase the PTF. However, in the foregoing cases, additional problems such as the generation of particles will arise.

The present invention is achieved by changing the structuration of the magnetic material, dividing the phase structure, and introducing uneven magnetic field response in the target, and does not entail the foregoing problems. This is a significant feature of the present invention. The present invention yields a significant advantage in being able to increase the PTF by approximately 5% to 20% in the same density.

As described above, the present invention is an improvement of Japanese Patent Application No. 2006-6575. Accordingly, certain subject matter explained in Japanese Patent Application No. 2006-6575 is common in the present invention, and will be used in the ensuing explanation.

A specific example that each particle of the nonmagnetic material with a texture observed in the polished face of the material is smaller than all hypothetical circles with a radius of 1 µm around an arbitrary point within the nonmagnetic particle, or has at least two contact points or intersection points between the respective hypothetical circles and the interface of the ferromagnetic material and the nonmagnetic material is as follows.

Figure 1:
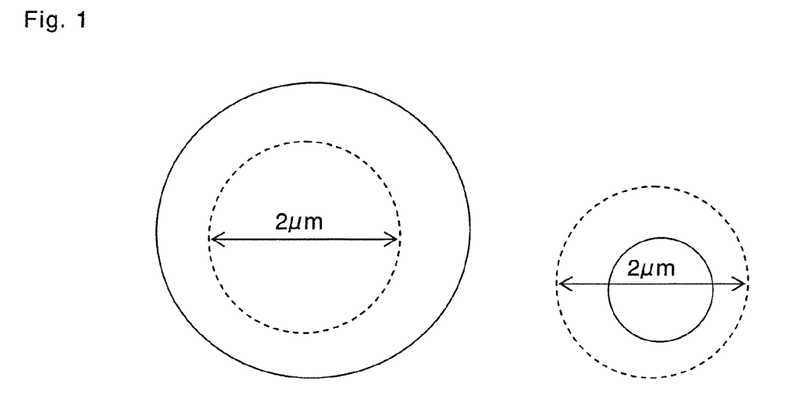
FIG. 1 is a view showing a frame format of spherical particles.

For example, in the case of spherical nonmagnetic particles, the left illustration of FIG. 1 is a view showing a frame format of a case where a hypothetical circle with a radius of 1 µm is included in the particle and this is a coarsen particle, and it does not correspond to the present invention. The right illustration of FIG. 1 shows a case of small particle where the radius of the particle is 1 µm or less and smaller than the hypothetical circle with a radius of 1 µm, and it corresponds to the present invention. These fine particles will not cause any particular problem concerning the generation of particles of the target, and it is possible to obtain a high-density target.

Figure 2:
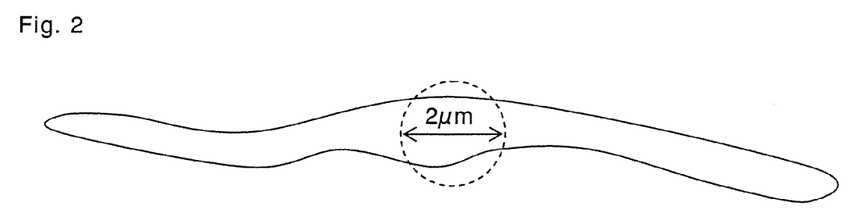
FIG. 2 is a view showing a frame format of thread-shaped particles.

In the case of thread-shaped nonmagnetic particles, FIG. 2 is a view showing a frame format of such an example. There is no particular limitation on the length or curve so as long as it is within the hypothetical circle with a radius of 1 μm or less around an arbitrary point in the cross section of the nonmagnetic particle. Thin thread-shaped particles follow the object of the present invention, and will not cause any particular problem.

Figure 3:
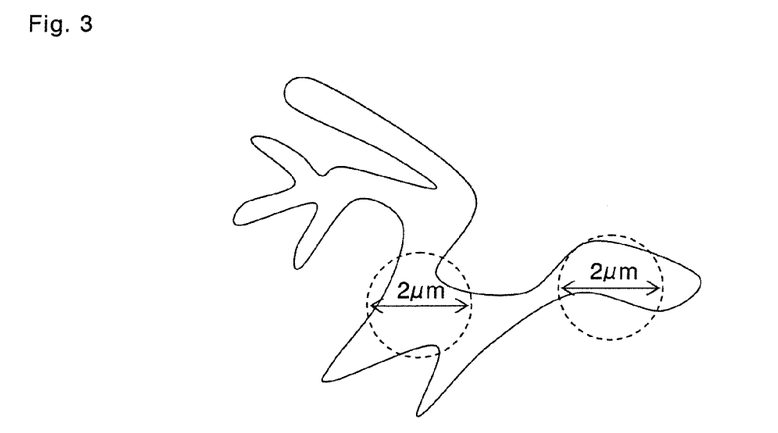
FIG. 3 is a view showing a frame format of web-shaped particles.

FIG. 3 is a view showing a frame format of the web-shaped particles. In principle, these particles are the same as the foregoing thin thread-shaped particles. In this case, although there are cases where the nodes of the web will become coarse and exceed the hypothetical circle with a radius of 1 μm, this case is outside the scope of the present invention.

The thread-shaped or star-shaped or web-shaped structure observed in the polished surface also exists in the thickness direction of the target as a matter of course. Since this star-shaped or web-shaped structure bonded in the thickness direction of the target will hardly cause shedding, it could be said that these are even more preferable. Increase in the contact area of the star-shaped or web-shaped particles and the ferromagnetic material to become the matrix is effective in preventing shedding. Thus, it could be said that it is desirable for the width of the thread-like shape or star shape or web shape to be small and particles having such shapes to be dispersed.

Figure 4:
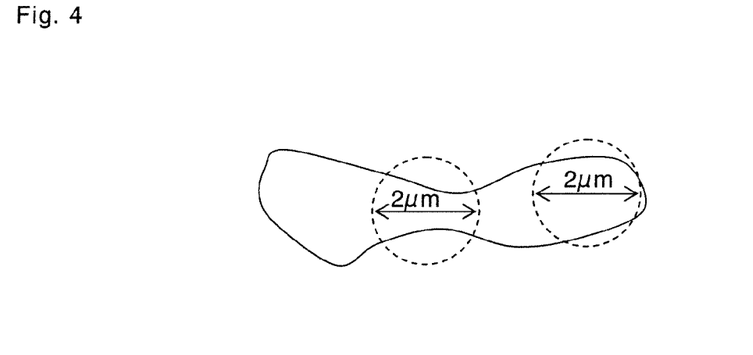
FIG. 4 is a view showing a frame format of gourd-shaped particles.

As other shapes, gourd-shaped particles may also be considered. FIG. 4 is a view showing a frame format of such gourd-shaped particles. In this case, although the constricted part will not be a particular problem, the bulged part needs to have a radius of 1 μm or less. In this respect, gourd-shaped particles are the same as spherical particles.

With the structuration of the target of nonmagnetic-particle-dispersed ferromagnetic material according to the present invention explained above, the schistose textures (B) with a short side of 30 to 100 μm and a long side of 50 to 300 μm formed from a Co—Cr alloy phase, a Co—Cr—Pt alloy phase or a Co—Cr—Pt—B alloy phase are formed in a matrix (phase (A) such that nonmagnetic particles formed of oxides are dispersed in a ferromagnetic material of the Co—Cr alloy, the Co—Cr—Pt alloy or the Co—Cr—Pt—B alloy).

If the size of the short side and the long side of a schistose texture (B) is greater than the foregoing numerical range, although the PTF (pass through flux) will further improve, there is a problem in that the driving force for sintering is small and a high-density target cannot be obtained. Meanwhile, if the size is smaller than the foregoing numerical range, the composition distribution will become uniform when attempting to obtain a high-density target, and improvement in the PTF (pass through flux) cannot be expected.

Although, in Japanese Patent Laid-Open Publication Nos. 2009-001860, 2009-001861 and 2009-001862, the PTF (pass through flux) is improved by using Co—Cr alloy powder, Co—Cr—B alloy powder or Co—Cr—Pt alloy powder having an average grain size of 20 μm as the raw powder, and causing the target texture to become a diplophase structure by suppressing the diffusion during the sintering process as much as possible. In the foregoing case, however, it is necessary to set the sintering temperature to be low and, consequently, such different problems as the density being low and particles being generated will arise. In light of the above, it is particularly effective in the present invention that the schistose textures (B) within the foregoing numerical range are to be generated.

Figure 6:
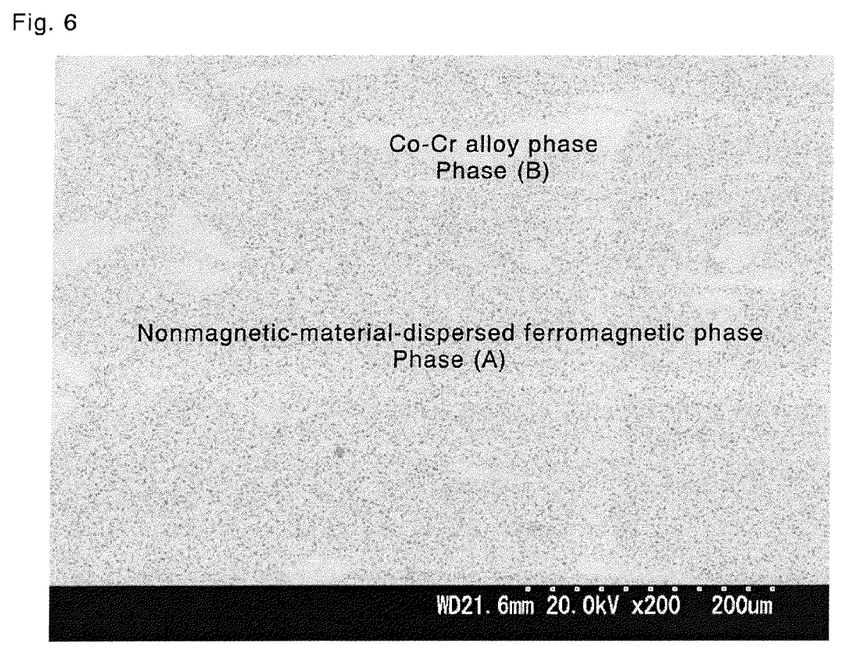
FIG. 6 is an SEM image of a polished face of the target obtained in Example 1.

The schistose texture (B) is of various sizes and is not uniform in any way as shown in FIG. 6 described later. In addition, the composition of the respective schistose textures is also not uniform, and forms a Co—Cr alloy phase or a Co—Cr—Pt alloy phase or a Co—Cr—Pt—B alloy phase with non-uniform Cr concentration in which the Cr is concentrated at 25 at % or more near the center and the Cr content gradually becomes lower toward the periphery than the central part. This is a structuration that is unique to the target of the present invention, and is considered to significantly contribute to the improvement of the PTF (pass through flux) in the present invention. In addition, with the sputtering target of nonmagnetic-particle-dispersed ferromagnetic material according to the present invention, which has the foregoing structuration; the relative density can be made to be 97% or higher.

EXAMPLES

The present invention is now explained in detail with reference to the Examples and Comparative Examples. These Examples are merely illustrative, and the present invention shall in no way be limited thereby. In other words, various modifications and other embodiments based on the technical spirit claimed in the claims shall be included in the present invention as a matter of course.

Examples 1 and 2 and Comparative Examples 1 and 2

As sintering raw powder, Co—Cr alloy powder that was sorted with sieves having different sized sieve mesh, and fine powder (average grain size of 1 to 2 μm) of Co and silicon oxide ($SiO_2$) are used. In Example 1, Co—Cr alloy powder of 75 μm or larger and less than 150 μm was used, and in Example 2, Co—Cr alloy powder of 20 μm or larger and less than 75 μm was used. Moreover, in Comparative Example 1, Co—Cr alloy powder of less than 20 μm was used, and in Comparative Example 2, Co—Cr alloy powder was not used and Cr powder of less than 20 μm was used. The Co—Cr alloy powder that was used herein is of a composition containing Cr at 40 at % or more.

The foregoing powders were weighed to achieve a composition of 77.28Co-14.72Cr-8$SiO_2$ (mol %), and mixed in a wet ball mill for 20 hours. Subsequently, after the mixed powder was filled in a carbon mold and sintered with the hot press (HP) at 1050° C. for 2 hours, it was further subject to hot isostatic pressing (HIP) to prepare a sintered compact, and the obtained sintered compact was machined to obtain a disk-shaped target having a diameter of 180 mm and a thickness of 7 mm. The relative density of the obtained targets was 97% or higher in all cases, and certain targets even exceeded 98%. The results are shown in Table 1.

TABLE 1

| | Raw Powder | Area Ratio of Phase (B) | PTF |
| --- | --- | --- | --- |
| Example 1 | Co—Cr powder of 75 to 150 μm + Co powder + $SiO_2$ powder | 7% | 60% |
| Example 2 | Co—Cr powder of 20 to 75 μm + Co powder + $SiO_2$ powder | 4% | 54% |
| Comparative Example 1 | Co—Cr powder of less than 20 μm + Co powder + $SiO_2$ powder | — | 49% |
| Comparative Example 2 | Cr powder of less than 20 μm + Co powder + $SiO_2$ powder | — | 47% |

Figure 5:
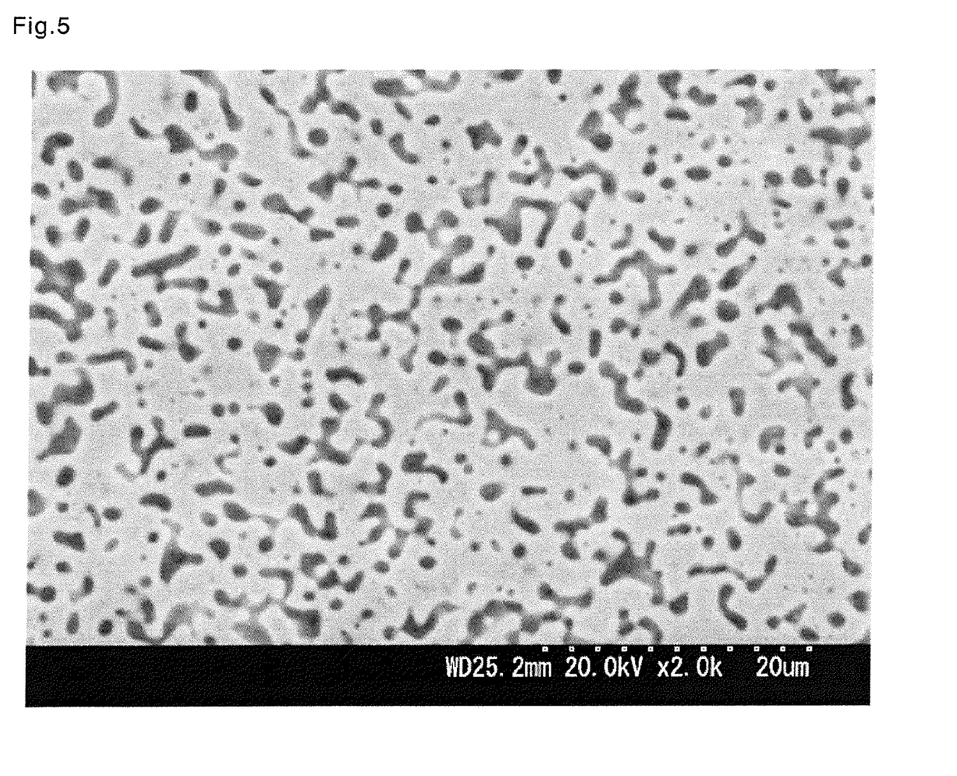
FIG. 5 is an enlarged SEM image of the matrix portion of a polished face of the target obtained in Example 1.

The enlarged SEM image of the obtained matrix of Example 1 is shown in FIG. 5. As shown in FIG. 5, thread-shaped fine $SiO_2$ particles were dispersed in the matrix. In this case, when drawing a perpendicular line from an arbitrary point in any $SiO_2$ particles as the nonmagnetic material toward the interface, the distance to the interface was within the range of 2 μm or less. In other words, this case satisfied the condition of the present invention in which each of the nonmagnetic particles has such a shape and size that the particle is smaller than all hypothetical circles with a radius of 1 μm around an arbitrary point within the nonmagnetic particle, or a shape and size with at least two contact points or intersection points between the respective hypothetical circles and the interface of the ferromagnetic material and the nonmagnetic material.

Meanwhile, what is particularly unique in Example 1 is that, as shown in FIG. 6, Co—Cr alloy phases as a large schistose texture are dispersed in the matrix with fine $SiO_2$ particles dispersed therein. The area of these Co—Cr alloy phases is 7% when represented in the ratio to the overall area. In the foregoing case, the PTF was 60% and showed a high value. As a result of observing the element distribution of the Co—Cr alloy phase with EPMA, in many cases, it was confirmed that a Cr-rich phase in which Cr is concentrated at 25 at % or more exists near the center of the Co—Cr alloy phase and the Cr concentration gradually becomes lower as it approaches the periphery.

Figure 7:
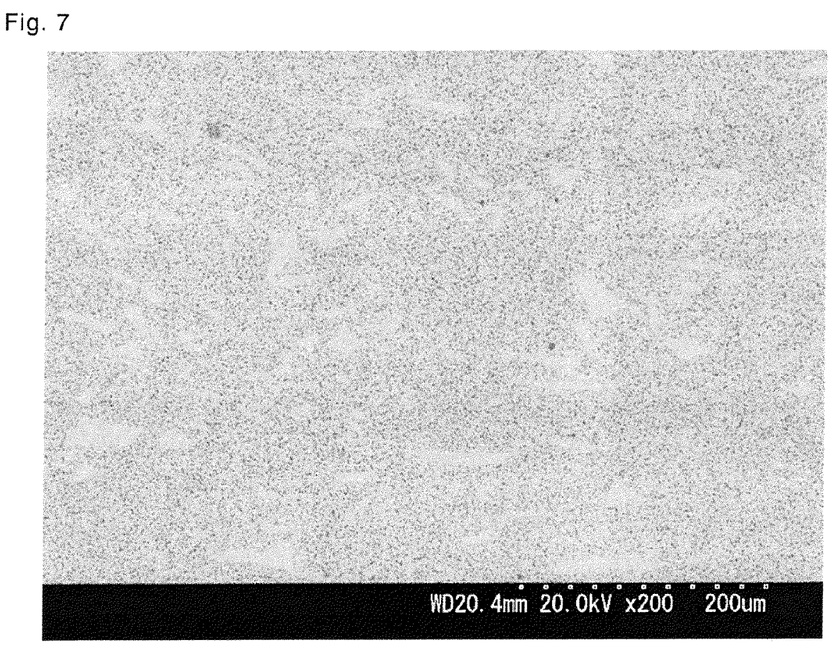
FIG. 7 is an SEM image of a polished face of the target obtained in Example 2.

FIG. 7 is an SEM image of the polished face of the target obtained in Example 2. As shown in FIG. 7, thread-shaped fine $SiO_2$ particles were dispersed in the matrix. As is the case with Example 1, when drawing a perpendicular line from an arbitrary point in any $SiO_2$ particles as the nonmagnetic material toward the interface, the distance to the interface was within the range of 2 μm or less. In other words, this case satisfied the condition of the present invention in which each of the nonmagnetic particles has such a shape and size that the particle is smaller than all hypothetical circles with a radius of 1 μm around an arbitrary point within the nonmagnetic particle, or a shape and size with at least two contact points or intersection points between the respective hypothetical circles and the interface of the ferromagnetic material and the nonmagnetic material.

Meanwhile, in the foregoing Example 2, as shown in FIG. 7, Co—Cr alloy phases as a large schistose texture were dispersed in the matrix with fine $SiO_2$ particles dispersed therein. The area of these Co—Cr alloy phases is 4% when represented in the ratio to the overall area. In the foregoing case, the PTF was 54% and showed a high value. As a result of observing the element distribution of the Co—Cr alloy phase with EPMA, as is the case with Example 1, it was confirmed that a Cr-rich phase in which Cr is concentrated at 25 at % or more exists near the center of the Co—Cr alloy phase and the Cr concentration gradually becomes lower as it approaches the periphery.

Figure 8:
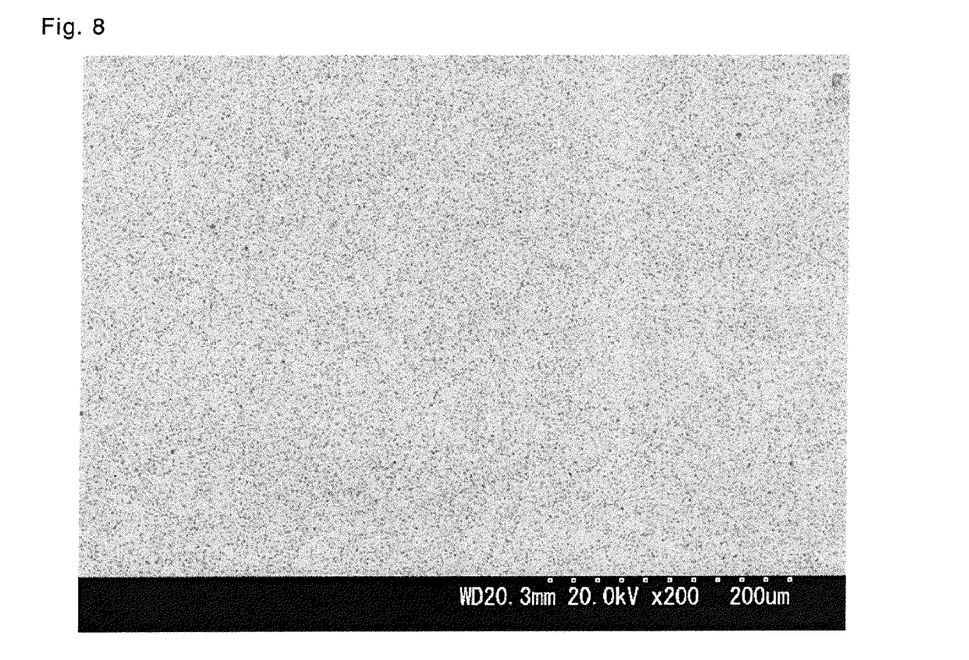
FIG. 8 is an SEM image of a polished face of the target obtained in Comparative Example 1.
Figure 9:
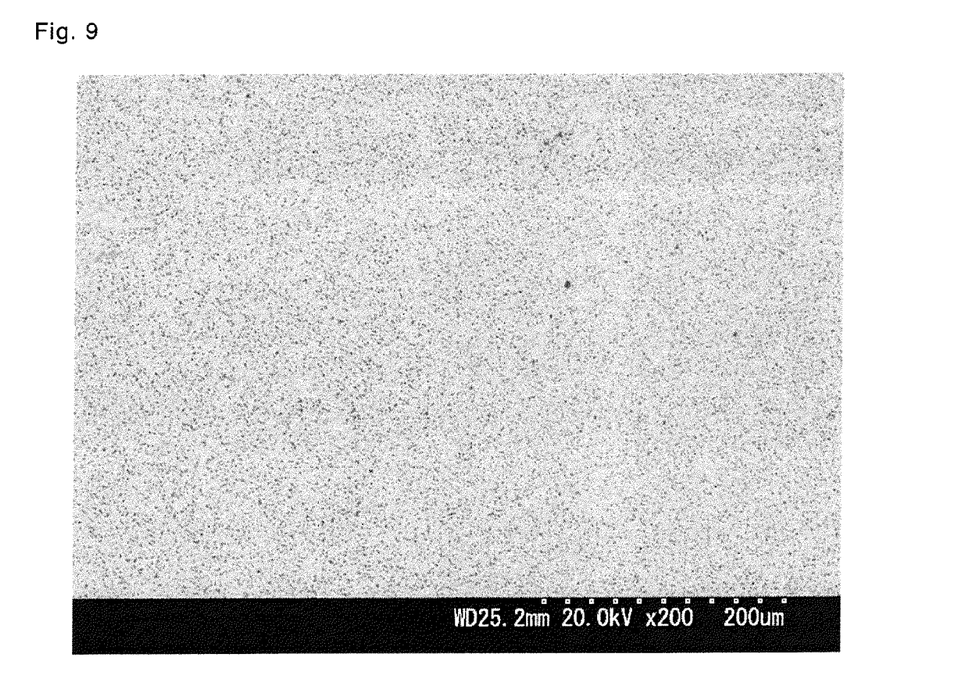
FIG. 9 is an SEM image of a polished face of the target obtained in Comparative Example 2.

Contrarily, in Comparative Example 1, a schistose Co—Cr alloy phase was not observed anywhere in the matrix in which $SiO_2$ particles are dispersed. FIG. 8 is an SEM image of the polished face of the target obtained in Comparative Example 1, and a schistose texture could not be found in FIG. 8. Moreover, FIG. 9 is an SEM image of the polished face of the target obtained in Comparative Example 2. In Comparative Example 2, it is not possible to make a distinction between the matrix with the $SiO_2$ particles dispersed therein and the Co—Cr alloy phase, and the observation of the Co—Cr alloy phase was difficult. The PTF value in Comparative Example 1 was 49%, and the PTF value in Comparative Example 2 was 47%. No improvement in the PTF could be acknowledged.

Example 3 and Comparative Example 3

In Example 3, the Co—Cr alloy powder of 75 to 150 μm also used in Example 1, and fine powder (average grain size of 1 to 2 μm) of Co, Pt and $SiO_2$ were used as the sintering raw powder. In Comparative Example 3, Cr powder of less than 20 μm and fine powder (average grain size of 1 to 2 μm) of Co, Pt and $SiO_2$ were used as the sintering raw powder. The foregoing powders were weighed to achieve a composition of 60Co-16Cr-16Pt-8$SiO_2$ (mol %), and mixed in a wet ball mill for 20 hours. Subsequently, after the mixed powder was filled in a carbon mold and sintered with the hot press (HP) at 1050° C. for 2 hours, it was further subject to hot isostatic pressing (HIP) to prepare a sintered compact, and the obtained sintered compact was machined to obtain a disk-shaped target having a diameter of 165.1 mm and a thickness of 7 mm. The relative density of the obtained targets was 97% or higher. The results are shown in Table 2.

TABLE 2

|  | Raw Powder | Area Ratio of Phase (B) | PTF |
|---|---|---|---|
| Example 3 | Co—Cr powder of 75 to 150 μm + Co powder + Pt powder + $SiO_2$ powder | 10% | 69% |
| Comparative Example 3 | Cr powder of less than 20 μm + Co powder + Pt powder + $SiO_2$ powder | — | 53% |

Figure 10:
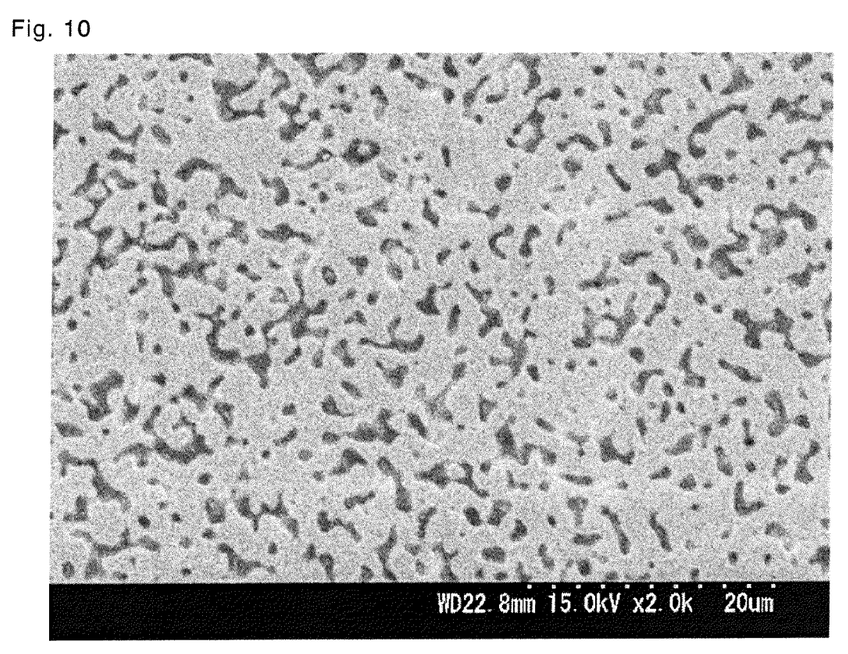
FIG. 10 is an enlarged SEM image of the matrix portion of a polished face of the target obtained in Example 3.

FIG. 10 is an enlarged SEM image of the obtained matrix of Example 3. As shown in FIG. 10, thread-shaped fine $SiO_2$ particles were dispersed in the matrix. In this case, when drawing a perpendicular line from an arbitrary point in any $SiO_2$ particles as the nonmagnetic material toward the interface, the distance to the interface was within the range of 2 μm or less. In other words, this case satisfied the condition of the present invention in which each of the nonmagnetic particles has such a shape and size that the particle is smaller than all hypothetical circles with a radius of 1 μm around an arbitrary point within the nonmagnetic particle, or a shape and size with at least two contact points or intersection points between the respective hypothetical circles and the interface of the ferromagnetic material and the nonmagnetic material.

Figure 11:
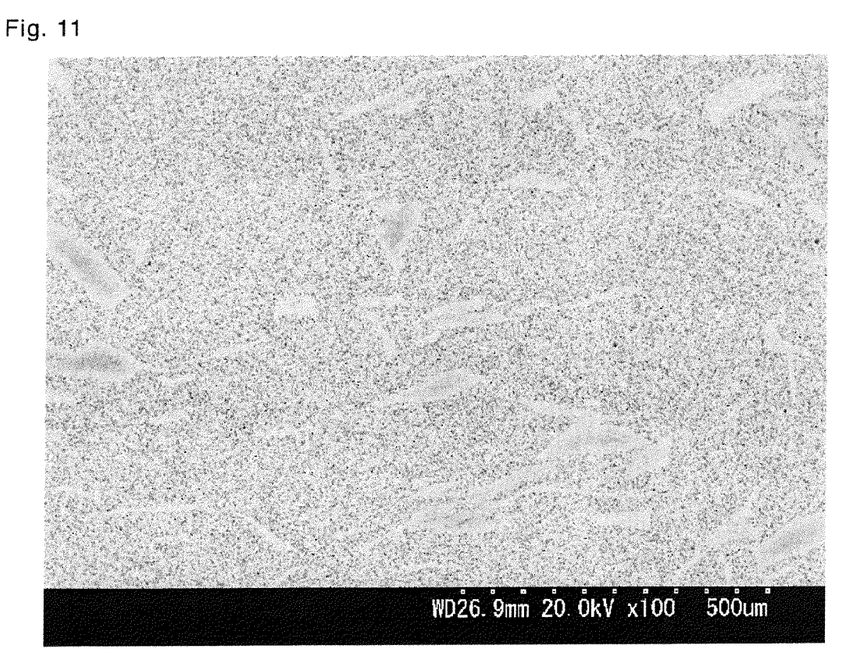
FIG. 11 is an SEM image of a polished face of the target obtained in Example 3.

In foregoing Example 3, it was possible to observe that Co—Cr—Pt alloy phases as a large schistose texture are dispersed in the matrix with fine $SiO_2$ particles dispersed therein. The results are shown in FIG. 11. When the area of the Co—Cr—Pt alloy phases shown in FIG. 11 is represented in the ratio to the overall area, it reached 10%. In the foregoing case, the PTF was 69% and showed an extremely high value.

Figure 12:
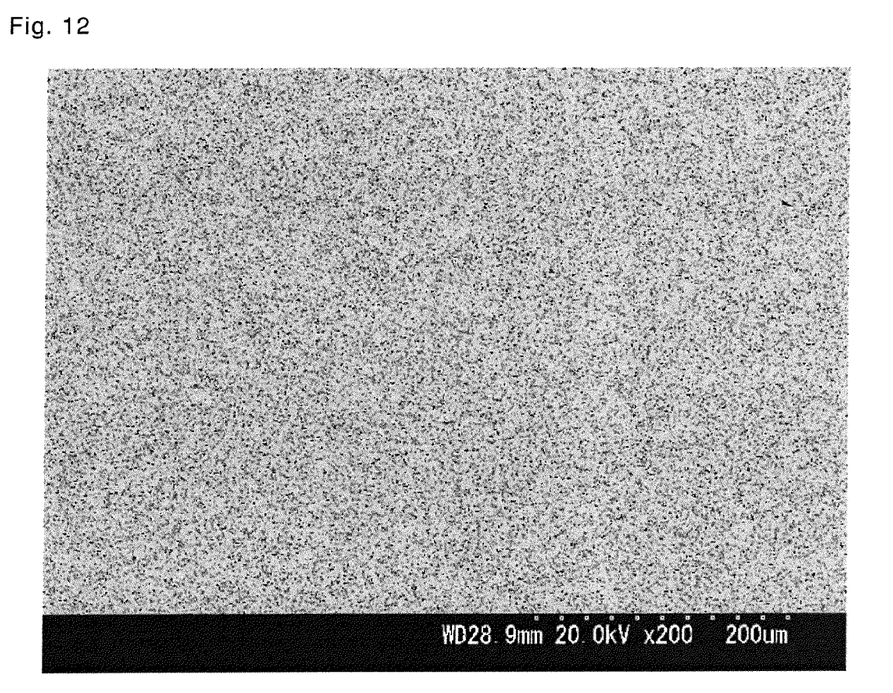
FIG. 12 is an SEM image of a polished face of the target obtained in Comparative Example 3.
Figure 13:
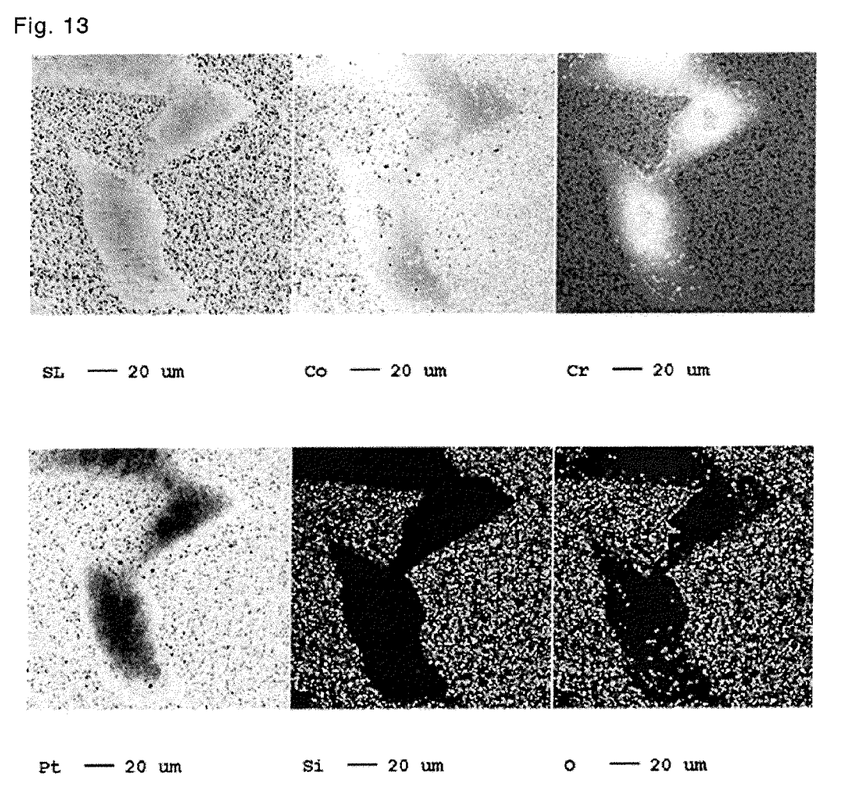
FIG. 13 is an element distribution image measured with the EPMA of a polished face of the target obtained in Example 3.

Meanwhile, FIG. 12 shows the texture of Comparative Example 3, but a schistose texture could not be observed anywhere in the matrix, and the PTF was 53%. Moreover, the results of measuring the element distribution in Example 3 with EPMA are shown in FIG. 13. Here, the white portions are the areas in which these elements are considerably distributed. In the image shown in FIG. 13, the portion near the center of the schistose texture (B) is Cr-rich, and the Cr concentration is decreasing toward the periphery. Accordingly, it is evident that the schistose texture (B) is forming a Co—Cr—Pt alloy phase of non-uniform composition.

Example 4 and Comparative Example 4

In Example 4, the Co—Cr alloy powder of 75 to 150 μm also used in Example 1, B powder having an average grain size of 5 μm, and fine powder (average grain size of 0.5 μm to 2 μm) of Co, Pt and TiO$_2$ were used as the sintering raw powder. In Comparative Example 4, Cr powder of less than 20 μm, B powder having an average grain size of 5 μm, and fine powder (average grain size of 0.5 μm to 2 μm) of Co, Pt and TiO$_2$ were used as the sintering raw powder. The foregoing powders were weighed to achieve a composition of 57Co-16Cr-16Pt-3B-8TiO$_2$ (mol %), and mixed in a wet ball mill for 20 hours. Subsequently, after the mixed powder was filled in a carbon mold and sintered with the hot press (HP) at 1050° C. for 2 hours, it was further subject to hot isostatic pressing (HIP) to prepare a sintered compact, and the obtained sintered compact was machined to obtain a disk-shaped target having a diameter of 165.1 mm and a thickness of 6.4 mm. The relative density of the obtained targets was 98% or higher. The results are shown in Table 3.

TABLE 3

| | Raw Powder | Area Ratio of Phase (B) | PTF |
|---|---|---|---|
| Example 4 | Co—Cr powder of 75 to 150 μm + Co powder + Pt powder + B powder + TiO$_2$ powder | 7% | 65% |
| Comparative Example 4 | Cr powder of less than 20 μm + Co powder + Pt powder + B powder + TiO$_2$ powder | — | 59% |

Figure 14:
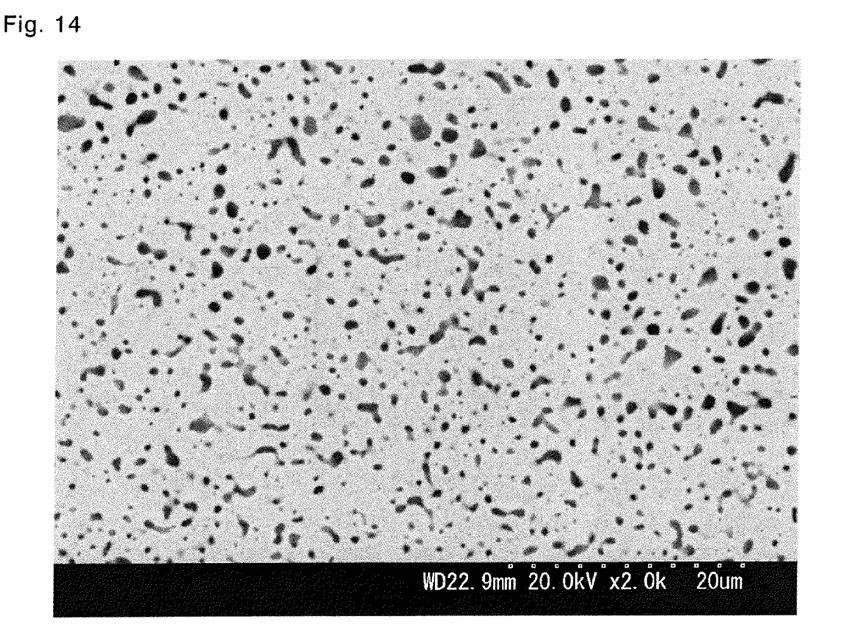
FIG. 14 is an enlarged SEM image of the matrix portion of a polished face of the target obtained in Example 4.

FIG. 14 is an enlarged SEM image of the obtained matrix of Example 4. As shown in FIG. 14, thread-shaped fine TiO$_2$ particles were dispersed in the matrix. In this case, when drawing a perpendicular line from an arbitrary point in any TiO$_2$ particles as the nonmagnetic material toward the interface, the distance to the interface was within the range of 2 μm or less. In other words, this case satisfied the condition of the present invention in which each of the nonmagnetic particles has such a shape and size that the particle is smaller than all hypothetical circles with a radius of 1 μm around an arbitrary point within the nonmagnetic particle, or a shape and size with at least two contact points or intersection points between the respective hypothetical circles and the interface of the ferromagnetic material and the nonmagnetic material.

Figure 15:
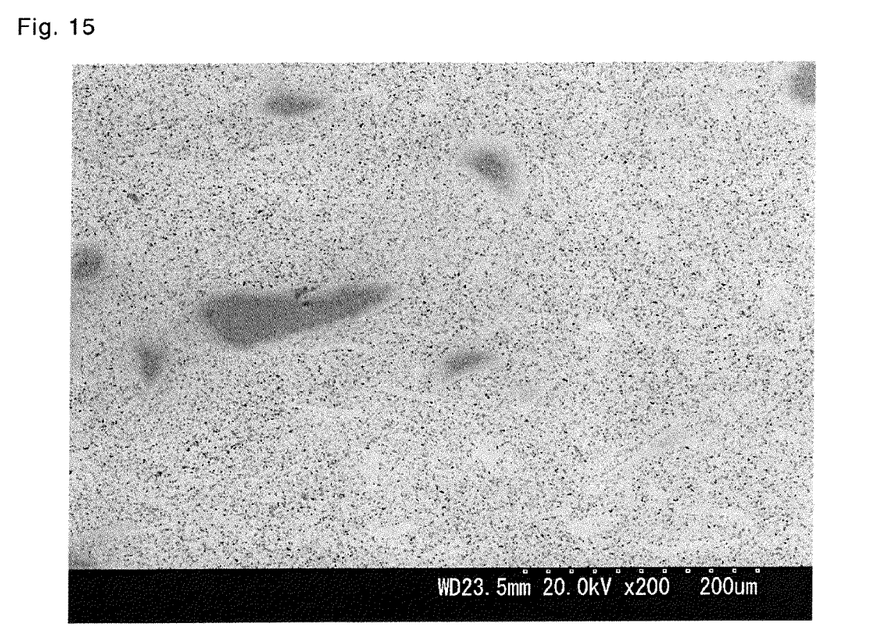
FIG. 15 is an SEM image of a polished face of the target obtained in Example 4.

In foregoing Example 4, it was possible to observe that Co—Cr—Pt—B alloy phases as a large schistose texture are dispersed in the matrix with fine TiO$_2$ particles dispersed therein. The results are shown in FIG. 15. When the area of the Co—Cr—Pt—B alloy phases shown in FIG. 15 is represented in the ratio to the overall area, it reached 7%. In the foregoing case, the PTF was 65%.

Figure 16:
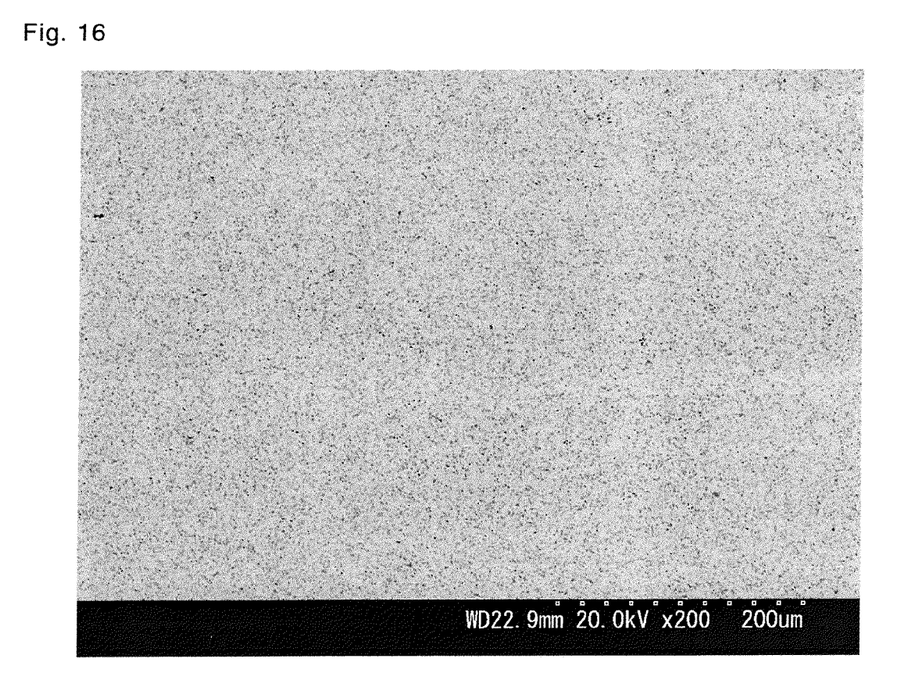
FIG. 16 is an SEM image of a polished face of the target obtained in Comparative Example 4.

Meanwhile, FIG. 16 shows the texture of Comparative Example 4, but a schistose texture could not be observed anywhere in the matrix, and the PTF was 59%.

As evident from the above, it should be easy to understand that the existence of a matrix phase (A) with nonmagnetic particles dispersed therein, and a Co—Cr alloy phase (B) (or Co—Cr—Pt alloy phase (B) or Co—Cr—Pt—B alloy phase (B)) with a short side of 30 to 100 μm and a long side of 50 to 300 μm encompassed by the phase (A) plays an extremely important role in improving the PTF.

As described above, the existence of the phase (B) separated from the matrix phase (A) blocks the exchange interaction of the phase (A), and the difference in the Cr concentration in the phase (B) generates a lattice distortion. It would appear that this yields the effect of improving the PTF. In Examples 1, 2, 3 and 4, it is clear that the Co—Cr alloy phases (B) or the Co—Cr—Pt alloy phases (B) or the Co—Cr—Pt—B alloy phases (B) exist in all cases, and it is evident that this correlates with the increase in the PTF. Although not shown in the foregoing Examples, in similar experiments, a more improvement in the PTF was confirmed when the area ratio of the phase (B) was 4% to 30%.

If the area ratio of the phase (B) is less than 4%, the PTF will not improve significantly. Thus, the area ratio of the phase (B) is desirably 4% or more. Moreover, although this will also depend on the amount of nonmagnetic particles, if the area ratio of the phase (B) exceeds 30%, the volume ratio of the nonmagnetic particles in the matrix phase will relatively increase, and it will become difficult to finely disperse the nonmagnetic particles. Thus, as a preferable condition, the area ratio of the phase (B) is 4% to 30%.

The conditions described in the present invention are an extension of the foregoing Examples. A person skilled in the art will obviously be able to work the foregoing conditions and sufficiently recognize the effect of the present invention.

As a result of highly dispersing the nonmagnetic materials, improving the PTF (pass through flux) by having schistose textures with non-uniform composition in the ferromagnetic phase in which the nonmagnetic materials are dispersed, and further achieving a high density in which the relative density is 97% or higher; the present invention realizes stable and highly efficient sputtering with a sputtering target of nonmagnetic-particle-dispersed ferromagnetic material by a DC magnetron sputtering system.

Accordingly, the present invention contributes significantly to the field of magnetic recording material, and particularly contributes to the improvement in mass productivity and yield in the deposition of magnetic recording layers.

The invention claimed is:

1. A sintered sputtering target comprising a ferromagnetic alloy dispersed with nonmagnetic oxide particles characterized in that:
    the ferromagnetic alloy contains a composition consisting essentially of 5-20 at Cr, 5-30 at % Pt, 0.5-8 at % B, and Co as remainder;
    the sintered sputtering target has a structure comprising a ferromagnetic alloy phase (A) in which the nonmagnetic oxide particles and particles of a Co—Cr—Pt—B alloy phase (B) are dispersed, the particles of the Co—Cr—Pt—B alloy phase (B) having a schistose shape with a short side length of 30 to 100 μm and a long side length of 50 to 300 μm; and
    Cr is concentrated to 25 at % or more at a central part of each of the particles of the Co—Cr—Pt—B alloy phase (B) and is lower in concentration at a periphery of each of the particles of the Co—Cr—Pt—B alloy phase (B).

2. The sputtering target according to claim 1, wherein, in any cross-section extending through the sputtering target, the Co—Cr—Pt—B alloy phase (B) has an area ratio of 4% or more and 30% or less relative to an overall area of the cross-section including the phase (A) in which the nonmagnetic oxide particles are dispersed.

3. The sputtering target of nonmagnetic-particle-dispersed ferromagnetic material according to claim 1, wherein the nonmagnetic material is one or more types of oxides selected from Cr, Ta, Si, Ti, Zr, Al, Nb and B.

4. The sputtering target according to claim 1, wherein the nonmagnetic oxide particles have a volume ratio of 10% or more and 30% or less relative to a total volume of the sputtering target.

5. The sputtering target of nonmagnetic-particle-dispersed ferromagnetic material according to claim 1, wherein a relative density of the sputtering target is 97% or higher.

* * * * *